(12) United States Patent
Yoon et al.

(10) Patent No.: US 10,916,681 B2
(45) Date of Patent: Feb. 9, 2021

(54) SEMICONDUCTOR STACKING STRUCTURE, AND METHOD AND APPARATUS FOR SEPARATING NITRIDE SEMICONDUCTOR LAYER USING SAME

(71) Applicant: SAMSUNG ELECTRONICS CO., LTD., Suwon-si (KR)

(72) Inventors: Eui-Joon Yoon, Seoul (KR); Dae-Young Moon, Seoul (KR); Jeong-Hwan Jang, Busan (KR); Yongjo Park, Gyeonggi-do (KR); Duk-Kyu Bae, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/271,102

(22) Filed: Feb. 8, 2019

(65) Prior Publication Data

US 2019/0189845 A1    Jun. 20, 2019

Related U.S. Application Data

(63) Continuation of application No. 15/325,984, filed as application No. PCT/KR2015/007271 on Jul. 13, 2015, now Pat. No. 10,205,052.

(30) Foreign Application Priority Data

Jul. 14, 2014    (KR) .................. 10-2014-0088503

(51) Int. Cl.
*H01L 33/12*    (2010.01)
*H01L 33/22*    (2010.01)
(Continued)

(52) U.S. Cl.
CPC .......... *H01L 33/12* (2013.01); *H01L 21/0242* (2013.01); *H01L 21/0254* (2013.01);
(Continued)

(58) Field of Classification Search
CPC .................. H01L 33/12; H01L 21/0242; H01L 21/02433; H01L 21/02488;
(Continued)

(56) References Cited

U.S. PATENT DOCUMENTS

| 6,380,108 | B1 | 4/2002 | Linthicum |
| 7,282,381 | B2 * | 10/2007 | Feltin .................. C30B 25/02 |
| | | | 117/922 |

(Continued)

FOREIGN PATENT DOCUMENTS

| JP | 2000-331937 A | 11/2000 |
| JP | 2002200599 A | 7/2002 |

(Continued)

OTHER PUBLICATIONS

Nov. 23, 2015 International search Report for PCT/KR2015/007271.

(Continued)

*Primary Examiner* — Syed I Gheyas
(74) *Attorney, Agent, or Firm* — Sughrue Mion, PLLC

(57) ABSTRACT

A semiconductor stacking structure according to the present invention comprises: a monocrystalline substrate which is disparate from a nitride semiconductor; an inorganic thin film which is formed on a substrate to define a cavity between the inorganic thin film and the substrate, wherein at least a portion of the inorganic thin film is crystallized with a crystal structure that is the same as the substrate; and a nitride semiconductor layer which is grown from a crystallized inorganic thin film above the cavity. The method and apparatus for separating a nitride semiconductor layer according the present invention mechanically separate between the substrate and the nitride semiconductor layer. The mechanical separation can be performed by a method of separation of applying a vertical force to the substrate and the nitride semiconductor layer, a method of separation of applying a horizontal force, a method of separation of applying a force of a relative circular motion, and a combination thereof.

20 Claims, 15 Drawing Sheets

(51) Int. Cl.
*H01L 21/02* (2006.01)
*H01L 21/67* (2006.01)
*H01L 33/00* (2010.01)
*H01L 33/32* (2010.01)

(52) U.S. Cl.
CPC .... *H01L 21/0265* (2013.01); *H01L 21/02433* (2013.01); *H01L 21/02488* (2013.01); *H01L 21/02513* (2013.01); *H01L 21/02639* (2013.01); *H01L 21/67092* (2013.01); *H01L 33/007* (2013.01); *H01L 33/0093* (2020.05); *H01L 33/22* (2013.01); *H01L 33/32* (2013.01)

(58) Field of Classification Search
CPC .......... H01L 21/02513; H01L 21/0254; H01L 21/02639; H01L 21/0265; H01L 21/67092; H01L 33/007; H01L 33/0079; H01L 33/32; H01L 33/22
See application file for complete search history.

(56) References Cited

U.S. PATENT DOCUMENTS

| | | |
|---|---|---|
| 9,263,255 B2 | 2/2016 | Heo |
| 2004/0038513 A1 | 2/2004 | Kohl et al. |
| 2004/0147096 A1 | 7/2004 | Kitaoka |
| 2004/0206299 A1 | 10/2004 | Tadatomo et al. |
| 2004/0251519 A1 | 12/2004 | Sugahara |
| 2005/0048685 A1 | 3/2005 | Shibata |
| 2007/0054476 A1 | 3/2007 | Nakahata et al. |
| 2007/0072396 A1 | 3/2007 | Feltin et al. |
| 2012/0018750 A1 | 1/2012 | Wang et al. |
| 2014/0070372 A1 | 3/2014 | Yoon et al. |
| 2015/0048301 A1 | 2/2015 | Kilbury |
| 2015/0069418 A1 | 3/2015 | Heo |

FOREIGN PATENT DOCUMENTS

| | | |
|---|---|---|
| JP | 2007-73569 A | 3/2007 |
| JP | 2007-506635 A | 3/2007 |
| JP | 2009 298604 A | 12/2009 |
| JP | 2011-100902 A | 5/2011 |
| KR | 1020090028235 A | 3/2009 |
| KR | 10-1235239 B1 | 2/2013 |
| KR | 10-2013-0105993 A | 9/2013 |

OTHER PUBLICATIONS

Oct. 6, 2017 Office Action in connection with U.S. Appl. No. 15/325,984.

Mar. 26, 2018 Office Action in connection with U.S. Appl. No. 15/325,984.

Communication dated Mar. 19, 2019 issued by the Japanese Intellectual Property Office in counterpart Japanese Application No. 2017-523748.

\* cited by examiner (a) (b) (c)

(a)          (b)

SEMICONDUCTOR STACKING STRUCTURE, AND METHOD AND APPARATUS FOR SEPARATING NITRIDE SEMICONDUCTOR LAYER USING SAME

The present application is a continuation of Ser. No. 15/325,984, initially submitted on 12 Jan. 2017 as a submission under 35 U.S.C. § 371(c) of international application no. PCT/KR2015/007271, filed on 13 Jul. 2015 and published on 21 Jan. 2016 with publication no. WO 2016/010323 A1, which claims the benefit of the filing date of Korean Patent Application No. 10-2014-0088503 filed in the Republic of Korea on 14 Jul. 2014, the disclosure of which is incorporated herein by reference.

TECHNICAL FIELD

The present disclosure relates to a semiconductor layer of gallium nitride (GaN) or mixed nitride of gallium and other metal and its formation method. Furthermore, the present disclosure relates to an electronic or opto-electronic device including the layer, a nitride semiconductor substrate and its manufacturing method. The technical field of the present disclosure may be, in broad senses, defined as a semiconductor stacking structure for forming a nitride semiconductor layer with few crystal defects and high quality on a substrate and its formation method.

BACKGROUND ART

Nitride semiconductor of elements in Group III or V in the periodic table occupies an important position in the field of electronic and opto-electronic devices, and this field will be more important in the future. In practice, nitride semiconductor has a wide range of applications, ranging from laser diodes (LDs) to transistors that can operate at high frequency and high temperature. Furthermore, the range of applications includes ultraviolet light detectors, elastic surface wave (SAW) devices and light emitting diodes (LEDs).

For example, gallium nitride is known as a suitable material for applications of blue LEDs or high temperature transistors, but is being widely studied for the use of microwave electronic devices but not limited thereto. Furthermore, as stated herein, gallium nitride has a wide range of applications including gallium nitride-based alloys such as aluminum gallium nitride (AlGaN), indium gallium nitride (InGaN) and aluminum indium gallium nitride (AlInGaN).

In devices using nitride semiconductor such as gallium nitride, the most frequently used substrate for growing a nitride semiconductor layer is a "heterogeneous" substrate such as sapphire, silicon carbide (SiC), and silicon. However, because these heterogeneous substrate materials have a lattice constant mismatch and a difference in thermal expansion coefficient with nitride, a nitride semiconductor layer grown on the heterogeneous substrate includes many crystal defects such as dislocation. The defect acts as a key factor that degrades the performance of nitride semiconductor devices such as LEDs.

Because a sapphire substrate has a higher thermal expansion coefficient than gallium nitride, when gallium nitride is grown at high temperature and then cooled down, compressive stress is applied to a gallium nitride epitaxial layer. Because a silicon substrate has a lower thermal expansion coefficient than gallium nitride, when gallium nitride is grown at high temperature and then cooled down, tensile stress is applied to a gallium nitride epitaxial layer. For this reason, a substrate warpage phenomenon occurs, and to prevent substrate warpage, the substrate thickness increases. The use of a thick substrate only contributes to the reduced superficial phenomenon, and is not technology that reduces the stress of a thin film itself. If the stress of a thin film itself is reduced, an advantage is that a thin substrate can be used. Furthermore, to separate a chip from a fabricated LED, a substrate needs to be ground while leaving about 100 μm, and in this circumstance, if a thin substrate can be used, great benefits will be gained in the aspect of LED production.

In some cases, the nitride semiconductor layer formed on the heterogeneous substrate should be separated from the heterogeneous substrate according to the need, and prior art proposed laser lift-off. However, even though a laser lift-off process is used, substrate warpage occurs due to a difference in thermal expansion coefficient between a sapphire substrate and nitride semiconductor, or a nitride semiconductor layer is melted using a laser and peeled off, so a side effect is the occurrence of thermal stress during the process due to high temperature heat at a local area. The laser lift-off process involves thermal and mechanical deformation and decomposition of nitride semiconductor. Due to laser beam impacts, the nitride semiconductor layer is susceptible to defects such as cracks and the nitride semiconductor layer may be damaged, and further, the nitride semiconductor layer is prone to breakage, and thus, the process is unstable.

Therefore, there is the demand for a substrate separation method with high reliability or a method for obtaining a high quality nitride semiconductor substrate or nitride semiconductor device.

DISCLOSURE

Technical Problem

The problem to be solved by the present disclosure is to provide a semiconductor stacking structure that forms a high quality nitride semiconductor layer with reduced stress applied to the nitride semiconductor layer when growing the nitride semiconductor layer and is easy to separate the nitride semiconductor layer from a substrate with no need for laser lift-off, and a method and apparatus for separating a nitride semiconductor layer using the same.

Technical Solution

To solve the above problem, a semiconductor stacking structure according to the present disclosure includes a monocrystalline substrate of a heterogeneous material from nitride semiconductor, an inorganic thin film including a leg portion contacting with the substrate to define a cavity between the inorganic thin film and the substrate and an upper surface portion extending from the leg portion parallel to the substrate, wherein at least a part of the inorganic thin film is crystalized with the same crystal structure as the substrate, and a nitride semiconductor layer grown from the crystalized inorganic thin film on the cavity.

Particularly, the cavity may consist of a plurality of cavities separated from each other, and may be a line type pattern extending in the direction perpendicular to a direction in which a lateral growth rate of the nitride semiconductor layer is fast. The nitride semiconductor layer may be in combined or non-combined form. The nitride semiconductor layer may be continuous or discontinuous in horizontal direction. The nitride semiconductor layer may consist of at least two films. An inorganic thin film defining cavities such as the above may be further formed between the at least two films.

There is provided a method for separating a nitride semiconductor layer according to the present disclosure. After a sacrificial layer pattern is formed on a monocrystalline substrate of a heterogeneous material from nitride semiconductor, an inorganic thin film is formed on the sacrificial layer pattern. The sacrificial layer pattern is removed from the substrate with the inorganic thin film, to form cavities defined by the substrate and the inorganic thin film. Subsequently, at least a part of the inorganic thin film is crystalized with the same crystal structure as the substrate, and a nitride semiconductor layer is grown from the crystalized inorganic thin film on the cavities. Subsequently, the nitride semiconductor layer is mechanically separated from the substrate.

The growing of a nitride semiconductor layer may include forming the nitride semiconductor layer as a plurality of nitride semiconductor layers separated from each other.

The sacrificial layer pattern may be formed by various methods. The sacrificial layer pattern may be formed by photolithography after applying a photoresist film onto the substrate, or may be formed by nano-imprint after applying resin for nano-imprint onto the substrate. Alternatively, the sacrificial layer pattern may be formed by adhering organic nanoparticles onto the substrate.

Preferably, the forming of an inorganic thin film is performed within the temperature range in which the sacrificial layer pattern is not deformed. The cavities are where the sacrificial layer pattern is removed away. Thus, the cavities conform to the shape and size and two-dimensional array of the sacrificial layer pattern. Accordingly, for the cavities to have the controlled shape and size and two-dimensional array, it is required to set the shape and size and two-dimensional array of the sacrificial layer pattern.

Another method for separating a nitride semiconductor layer according to the present disclosure performs mechanical separation of a substrate and a nitride semiconductor layer in the semiconductor stacking structure according to the present disclosure.

Still another method for separating a nitride semiconductor layer according to the present disclosure performs mechanical separation of a substrate and a nitride semiconductor layer in other semiconductor stacking structure including an interfacial layer with cavities between the substrate and the nitride semiconductor layer even though the semiconductor stacking structure does not follow the present disclosure.

When the nitride semiconductor layer is separated from the substrate using this method, the nitride semiconductor layer may be transferred or moved to vertical or horizontal LEDs or any type of substrates to manufacture LEDs or nitride semiconductor free-standing substrates.

In the method for separating a nitride semiconductor layer according to the present disclosure, the mechanically separating may be performed by a method for separation by applying a force in vertical direction to the substrate and the nitride semiconductor layer, a method for separation by applying a force in horizontal direction, a method for separation by applying a force in relative circular motion, and its combined method.

Particularly, in the case of the method for separation by applying a force in vertical direction to the substrate and the nitride semiconductor layer, it is preferable to perform end point detection by sensing the thickness or pressure at which the substrate and the nitride semiconductor layer are compressed in vertical direction.

The method for separating a nitride semiconductor layer according to the present disclosure may further include, after separating the nitride semiconductor layer from the substrate, transferring the separated nitride semiconductor layer to other substrate or packaging the separated nitride semiconductor layer.

An apparatus for separating a nitride semiconductor layer according to the present disclosure performs mechanical separation of the nitride semiconductor layer from the substrate in the semiconductor stacking structure according to the present disclosure or other semiconductor stacking structure including an interfacial layer with cavities between the substrate and the nitride semiconductor layer even though the semiconductor stacking structure does not follow the present disclosure.

The apparatus may include a pair of separation member as jigs applied respectively to the substrate and the nitride semiconductor layer of the semiconductor stacking structure. The separation members and the semiconductor stacking structure may be temporarily adhered to each other. The temporary adhesion may be any of an adhesive layer, adhesive coating, an adhesive tape, an electrostatic force or a force by vacuum.

The apparatus may include a driving unit to apply an external force to the semiconductor stacking structure, and a control unit to control the driving unit. The driving unit may apply relative compression, tension, shear, torsion, and its combined external force to the substrate and the nitride semiconductor layer.

The separation apparatus according to the present disclosure may apply the external force while at least one of a pair of separation member is temporarily adhered to the semiconductor stacking structure, the pair of separation member as jigs applied respectively to the substrate and the nitride semiconductor layer of the semiconductor stacking structure. While any of the separation members is fixed, the external force in vertical direction, horizontal direction or rotation may be applied to the other separation member against the remaining one.

Particularly, it is preferable to fix any of the separation members and drive the other in vertical direction against the remaining one to provide a compressive force, and release the compressive force immediately after the nitride semiconductor layer and the substrate are separated by destruction of the inorganic thin film or the interfacial layer. In this instance, the control unit may control the driving unit to stop relative movements of the separation members or move the separation members apart from each other through end point detection for separation of the nitride semiconductor layer and the substrate. A separation sensing unit for the end point detection may be further provided. The separation sensing unit may perform the end point detection by a method for measuring the distance between the separation members or pressure monitoring.

The separation apparatus according to the present disclosure may further include a conveyance apparatus to transfer the separated nitride semiconductor layer to other substrate or package the separated nitride semiconductor layer.

The use of the semiconductor stacking structure according to the present disclosure and the method and apparatus for separating a nitride semiconductor layer using the same contributes to the manufacture of ultraviolet light detectors, elastic surface wave devices, LEDs, LDs, and microwave electronic devices, and can be expanded to modules and systems using the devices. In addition, nitride semiconductor free-standing substrates can be manufactured. Details of other embodiments are included in the detailed description and drawings.

Advantageous Effects

According to the present disclosure, the nitride semiconductor layer is grown on the inorganic thin film on the cavities. The inorganic thin film shares and relieves stress with the nitride semiconductor layer grown thereon, and thus, according to the present disclosure, the nitride semiconductor layer is grown with a low defect density and a high quality. Therefore, a low defect density and high quality nitride semiconductor layer is formed, and the reduced crystal defect density in nitride semiconductor increases the internal quantum efficiency.

Even though stress occurs in the nitride semiconductor layer due to a difference in thermal expansion coefficient between the substrate and the nitride semiconductor layer, stress is locally relieved, and as a consequence, a substrate warpage phenomenon will reduce. Although there is a difference in thermal expansion coefficient between the substrate and the nitride semiconductor layer, the cavities may be compressed or stretched by the nitride semiconductor layer, resulting in reduced stress applied to the nitride semiconductor layer. Accordingly, it is possible to use a relative thin substrate on a large scale substrate.

Particularly, because the sacrificial layer pattern is formed a controlled method such as photolithography or nano-imprint, the cavities are not formed irregularly or at random and are formed by a controlled method, leading to good reproducibility and superior device uniformity. As a result, it is possible to grow a nitride semiconductor epitaxial layer with outstanding properties, and realize opto-electronic devices with high efficiency and high reliability.

Due to the cavities and voids that can be created when forming the nitride semiconductor layer, the substrate and the nitride semiconductor layer are easy to mechanically separate from each other. The nitride semiconductor layer and the substrate can be mechanically separated by a small mechanical force or impact without applying great energy such as a laser. Accordingly, it is easy to separate the nitride semiconductor layer from the substrate even though laser lift-off is not used, making it easy to manufacture vertical LEDs or nitride semiconductor free-standing substrates.

Particularly, because the separation method and apparatus according to the present disclosure separates the nitride semiconductor layer from the substrate by a mechanical force without using a laser, the time and process costs are reduced as compared to a method using a laser, and production efficiency increases.

The present disclosure proposes a new mechanism for a method and apparatus for separating a nitride semiconductor layer from a substrate by a mechanical separation method. An inorganic thin film defining cavities, namely, an artificial nano-structure that can be easily destructed, is formed between the substrate and the nitride semiconductor layer, thereby separating the nitride semiconductor layer from the substrate with no need for an expensive laser device without a deterioration phenomenon caused by a laser.

It is possible to grow the nitride semiconductor layer continuously or discontinuously by adjusting the inorganic thin film structure defining the cavities, the two-dimensional array and the nitride semiconductor layer growth condition, thereby improving the performance of LEDs and reducing production costs.

MODE FOR CARRYING OUT THE INVENTION

Figure 1:
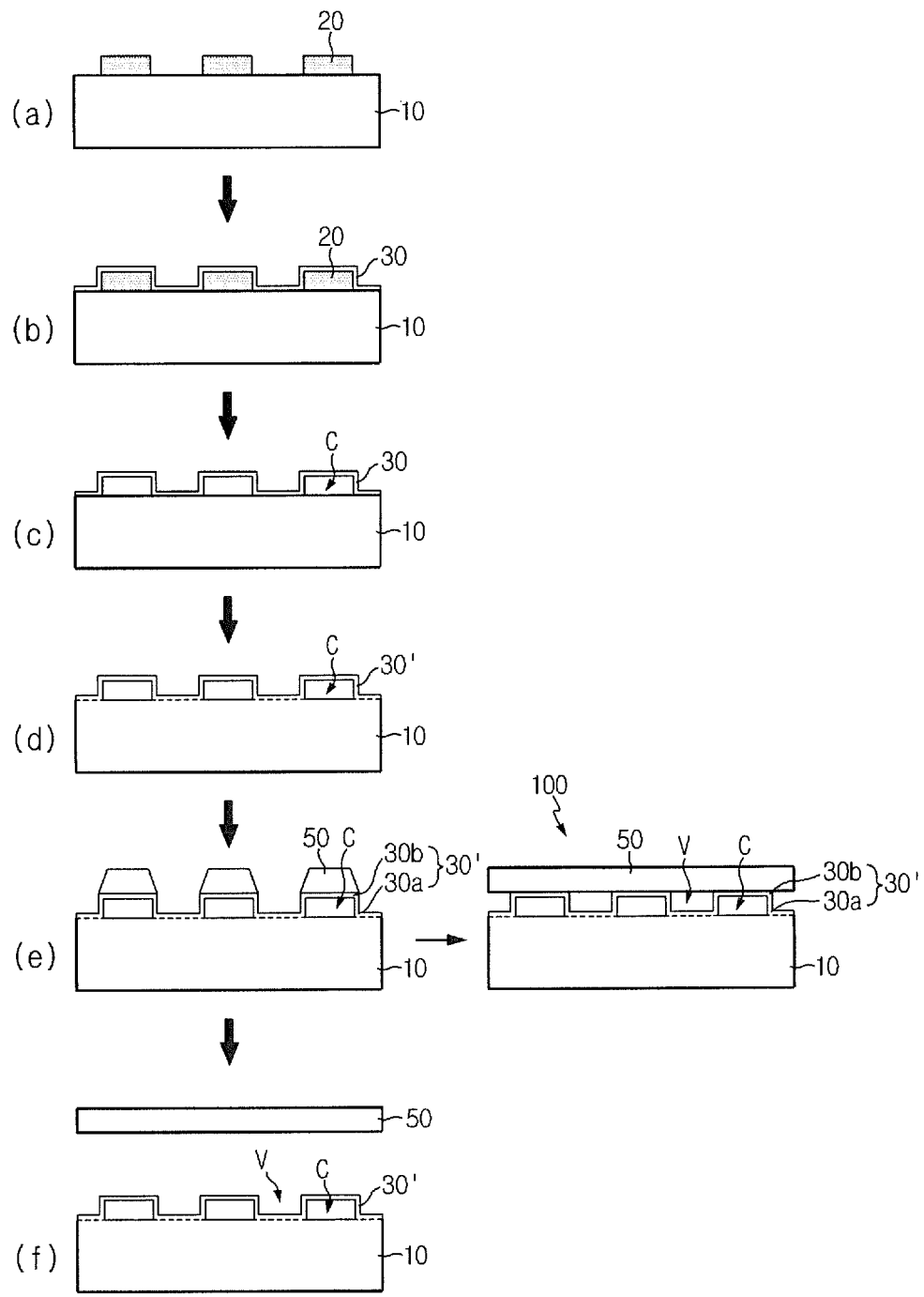
FIG. 1 is a diagram showing a semiconductor stacking structure and its formation method according to the present disclosure.

Hereinafter, the present disclosure will be described in further detail with reference to the accompanying drawings. The embodiments described hereinafter may be modified in many different forms, and the scope of the present disclosure is not limited to the following embodiments. The embodiments of the present disclosure are provided to help persons having ordinary skill in the art understand the present disclosure completely and fully. Accordingly, the shape of the elements in the drawings is exaggerated for clarity, and elements indicated by the same symbol in the drawings represent the same element.

The inventors have proposed various research results for relieving stress of a nitride semiconductor layer by forming cavities on a substrate of heterogeneous material, growing a nitride semiconductor layer, and deforming the cavities. This application is based on the research results of a method for manufacturing a LED or a nitride semiconductor free-standing or nitride semiconductor substrate in which a nitride semiconductor layer is separated from a substrate in the semiconductor stacking structure formed by the method proposed by the inventors, and is transferred or moved to a vertical LED or a horizontal LED, or any type of substrate, and a method and apparatus for separating a nitride semiconductor layer from a substrate to perform such method.

FIG. 1 is a diagram showing a semiconductor stacking structure and its formation method according to the present disclosure.

Referring to (a) of FIG. 1, first, a sacrificial layer pattern 20 is formed on a substrate 10. The thickness d of the sacrificial layer pattern 20 may be 0.01~10 µm and the width w of the sacrificial layer pattern 20 may be 0.01~10 µm. The thickness d and the width w of the sacrificial layer pattern 20 is determined in consideration of cavity to form in the end. Referring to (a) of FIG. 1, the sacrificial layer pattern 20 is formed uniformly in the same pattern over the entire substrate 10. However, the sacrificial layer pattern 20 may be formed in other pattern on the substrate 10, in part.

Figure 2:
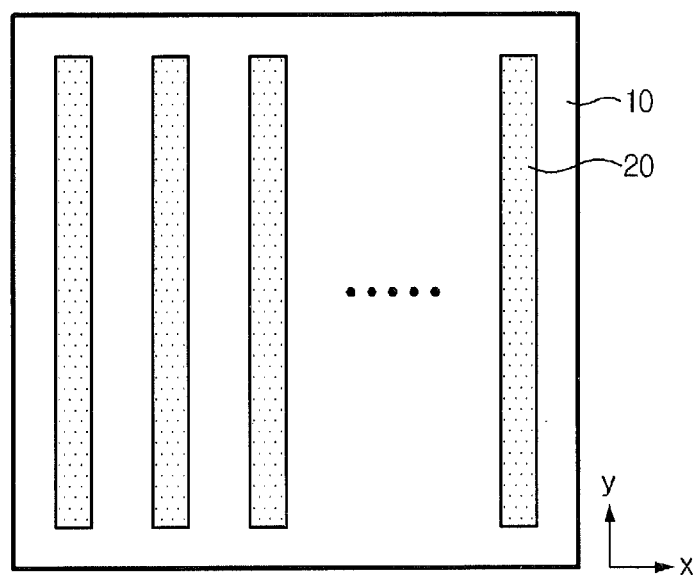
FIG. 2 is a diagram showing a two-dimensional array of a sacrificial layer pattern in a semiconductor stacking structure and its formation method according to the present disclosure.

FIG. 2 is a plan view of a two-dimensional array of the sacrificial layer pattern 20, showing a part of the substrate that forms a chip.

The sacrificial layer pattern 20 formed on the substrate 10 is of line and space type, and may extend in the direction of y axis or x axis on the substrate 10, and FIG. 2 shows that the sacrificial layer pattern 20 extends in the direction of y axis.

When a 500 nm line and space pattern is assumed, a chip of dimensions 1 mm×1 mm accommodates about 1000 sacrificial layer patterns 20. When the sacrificial layer pattern 20 is made to extend in one direction, a LED formed using the same has the controlled optical properties in any one direction, for example, making it possible to adjust polarization orientation.

Particularly, the sacrificial layer pattern 20 is preferably formed in a line type pattern extending in the direction perpendicular to a direction in which a lateral growth rate of a nitride semiconductor layer that will be subsequently formed is fast. For example, in FIG. 2, a nitride lateral growth rate in x axis direction is fast. In case the substrate 10 is sapphire, the direction in which a lateral growth rate of nitride is fast is <1-100>, and thus, the sacrificial layer pattern 20 is formed in a line pattern extending along the <11-20> direction perpendicular thereto. This is to grow a nitride semiconductor layer while encouraging Epitaxial Lateral Overgrowth (ELO) starting from the substrate 10 as maximum as possible.

The sacrificial layer pattern 20 of line type may be formed over the entire substrate 10, but may be also formed of an island type in which patterns are spaced apart. The island type will be preferred to being formed over the entire substrate 10 in the aspect of bowing prevention. As narrower intervals between the sacrificial layer patterns 20, the shorter length for lateral growth, there is no need to arrange line type patterns perpendicularly to the direction in which lateral growth is fast.

The sacrificial layer pattern 20 may be formed by various methods such as photolithography, nano-imprint, and inorganic nanoparticle attachment. According to the present disclosure, a method for forming the sacrificial layer pattern 20 is relatively simply, and as compared to substrate etching in earlier technology such as patterned sapphire substrate (PSS)a, the substrate is less damaged and the process can be simplified.

The substrate 10 where various sacrificial layer patterns 20 are formed as described above includes all monocrystalline substrates of heterogeneous material used to grow a heterogeneous epitaxial layer of a nitride semiconductor layer, such as sapphire, silicon, SiC, and GaAs substrates, and in this embodiment, a sapphire substrate is preferred.

After the sacrificial layer pattern 20 is formed as shown in (a) of FIG. 1, referring to (b) of FIG. 1, an inorganic thin film 30 is formed on the sacrificial layer pattern 20. The inorganic thin film 30 subsequently defines cavities between the inorganic thin film 30 and the substrate 10, and preferably, the inorganic thin film 30 is formed within the temperature range in which the sacrificial layer pattern 20 is not deformed. The inorganic thin film 30 has a sufficient thickness to stably maintain the original shape of the structure after the sacrificial layer pattern 20 is removed. A process for forming the inorganic thin film 30 uses various methods such as Atomic Layer Deposition (ALD), wet synthesis, metal deposition and oxidation, and sputtering. To form structurally stable cavities on the substrate 10, it is advantageous to bring a part of the inorganic thin film 30 into direct contact with the substrate 10 when forming the inorganic thin film 30. The inorganic thin film 30 may be at least one of oxide or nitride including silica ($SiO_2$), alumina ($Al_2O_3$), titania ($TiO_2$), zirconia ($ZrO_2$), yttria ($Y_2O_3$)-zirconia, copper oxide (CuO, $Cu_2O$), tantalum oxide ($Ta_2O_5$), aluminum nitride (AlN), and silicon nitride ($Si_3N_4$), and in this embodiment, alumina is preferred. By adjusting at least one of the composition, strength and thickness of the inorganic thin film 30, it is possible to regulate stress applied to a nitride semiconductor layer subsequently formed on the structure using the same. As shown, the inorganic thin film 30 is formed over the entire substrate 10, covering the sacrificial layer pattern 20.

In preferred embodiments, alumina may be formed with a uniform thickness to conform to the shape of the substrate 10 and the sacrificial layer pattern 20 by a deposition method such as ALD. Instead of the deposition method, a wet synthesis method using a wet solution can be used. After the wet solution is uniformly coated to conform to the shape of the substrate 10 and the sacrificial layer pattern 20, alumina may be synthesized through heating, drying, or a chemical reaction. For example, aluminum precursor powder such as aluminum chloride ($AlCl_3$) is mixed with a solvent such as tetrachloroethylene ($C_2Cl_4$), and then is applied to and coated on the substrate 10 with the sacrificial layer pattern 20, followed by heating in an oxygen atmosphere to cause a reaction, creating alumina thin film coating. Alternatively, after a metal Al thin film is deposited by a method such as sputtering, an oxidation process may be performed to form alumina. The alumina is formed in an amorphous state or in a polycrystalline state of fine grains.

After the inorganic thin film 30 is formed, the sacrificial layer pattern 20 is selectively removed from the substrate 10 as shown in (c) of FIG. 1. Because the sacrificial layer pattern 20 is polymer such as a photoresist film, resin for nano-imprint or organic nanoparticles, a method for easy removal is heating. The photoresist film having the autoignition temperature of approximately 600° C. can be easily removed by heat. Furthermore, for easier removal by burning using an oxidation process, a chemical reaction with gas including oxygen may be added. If it is heated at high temperature in an oxygen atmosphere, polymer components will be easily removed by a thermal decomposition process, commonly called ashing. For example, the sacrificial layer pattern 20 is removed by thermal treatment in an oxygen atmosphere. In the case that thermal treatment in oxygen atmosphere is not proper, for example, in the case that the substrate 100 is a silicon substrate, and there is concern about oxide generation, wet removal using an organic solvent can be used. After the sacrificial layer pattern 20 is removed, cavities C defined by the substrate 10 and the inorganic thin film 30 may be formed as shown in (c) of FIG. 1. Although a plurality of cavities C separated from each other is formed in this embodiment, the shape of the cavities may change depending on the shape of the sacrificial layer pattern 20 formed at the initial time. The cavities have an inverse shape of the sacrificial layer pattern.

The inorganic thin film 30 in an as-deposited state is generally amorphous or has poly crystals of fine grains. After the cavities C are formed by removing the sacrificial layer pattern 20, it is preferred to perform thermal treatment to densify and crystallize the amorphous or polycrystalline inorganic thin film 30.

The thermal treatment removing the sacrificial layer pattern 20 and the thermal treatment of the inorganic thin film 30 may be performed with the gradually increasing temperature or by a continuous process. In the case that the inorganic thin film 30 is a material of the same composition as the substrate 10 like the case that the substrate 10 is a sapphire substrate and the inorganic thin film 30 is alumina, if it is heated to, for example, approximately 1000° C., the inorganic thin film 30 becomes an inorganic thin film 30' crystallized with the same crystalline structure as the substrate 10 by thermal treatment as shown in (d) of FIG. 1. Accordingly, the interface between the crystallized inorganic thin film 30' and the substrate 10 (as indicated as a dotted line in the drawing) disappears. The reason is that a direct contact with the substrate 10 and solid phase epitaxy growth at the inorganic thin film 30 part occurs during high temperature thermal treatment, and crystallization occurs along the crystal direction of the substrate 10. The solid phase epitaxy starts from the interface between the substrate 10 and the inorganic thin film 30, and in the case that the inorganic thin film 30 is amorphous, the finally crystallized inorganic thin film 30' becomes polycrystalline, or the nano polycrystals increases in size, or in the most preferable case, change to a single crystal like the substrate 10. The crystallization preferably occurs over at least a part of the inorganic thin film 30, in particular, the entire inorganic thin film 30, and the crystallized inorganic thin film 30' parts on the cavities C acts as a seed in the subsequent growth of a nitride semiconductor epitaxial layer, so the inorganic thin film 30' parts on the cavities C needs to be crystallized.

Subsequently, as shown in (e) of FIG. 1, a nitride semiconductor layer 50 is further formed on the crystallized inorganic thin film 30'. The nitride semiconductor layer 50 may be formed with a multilayer structure including an optimum buffer layer. The nitride semiconductor layer 50 includes all nitride semiconductor materials such as GaN, InN, AlN or their combination GaxAlyInzN (0<x,y,z<1). The bandgap may be adjusted based on the material type of the nitride semiconductor layer 50 to emit light in the ultraviolet, visible and infrared ranges. In this instance, for the nitride semiconductor layer 50, the seed does not grow on the substrate 10, and grows from the crystallized inorganic thin film 30' parts on the cavities C (the left side picture in (e) of FIG. 1). The deposition temperature and the pressure and the flow rate of gas may be adjusted to grow the nitride semiconductor layer 50 from the crystallized inorganic thin film 30' on the cavities C.

The parts grown therefrom under the growth condition are combined to form a thin film, and voids V may be formed at the areas between the cavities C (the right side picture in (e) of FIG. 1). According to embodiments, before the nitride semiconductor layer 50 is combined, growth may be terminated. That is, the nitride semiconductor layer 50 is formed as a plurality of nitride semiconductor layers separated from each other by adjusting the epitaxial layer growth time. According to embodiments, a void V may not be formed.

Even though the nitride semiconductor layer is combined, if some parts are combined and some parts are not combined by adjusting the distance between the cavities C, the nitride semiconductor layer may be formed continuously or discontinuously in the horizontal direction. A part including the inorganic thin film 30', the cavities C and the optional voids V is referred to as an "interfacial layer" in the specification. By adjusting the configuration of the interfacial layer, the nitride semiconductor layer 50 may be also formed as a plurality of nitride semiconductor layers separated from each other.

If the nitride semiconductor layer 50 grows on the substrate 10 between the cavities C, in this instance, a film is formed on the substrate 10 by an ELO method, and overgrows in the horizontal direction on the cavities C and will be combined. However, in the present disclosure, the nitride semiconductor layer 50 does not grow on the substrate 10, and grows from the crystallized inorganic thin film 30' parts on the cavities C, so the nitride semiconductor layer 50 is formed in a completely different manner from an ELO method.

As the inorganic thin film 30' crystallized according to the present disclosure shares and relieves stress with the nitride semiconductor layer 50 grown thereon, the inorganic thin film 30' serves as a compliant layer and is grown while stress that may generate dislocation is relieved, and thus, low defect density and high quality growth is achieved.

The stress caused by a physical difference between the substrate and the thin film is converted to elastic energy at the interface, and becomes a driving force that generates dislocation. In normal case, because the thickness of the substrate is very thicker than the thin film, deformation is difficult, and instead, dislocation is generated in the thin film and stress is relieved. In this instance, when a thin film larger than or equal to a predetermined thickness or a critical thickness is grown, the elastic energy at the interface is greater than the generation energy of dislocation, so dislocation starts to generate. However, in the case of the present disclosure, because the critical thickness is larger when the inorganic thin film 30' is thinner than the nitride semiconductor layer 50, dislocation generation of the nitride semiconductor layer 50 is reduced. If the inorganic thin film 30' is enough thinner than the nitride semiconductor layer 50 as above, it can be said that the roles of the substrate and the thin film in normal case were changed, and the nitride semiconductor layer 50 grows in a state that dislocation occurs less. Accordingly, the nitride semiconductor layer 50 can be formed with a low defect density and a high quality, and because the nitride semiconductor crystal defect density reduces, the internal quantum efficiency in the manufacture of LEDs can be increased.

The semiconductor stacking structure 100 according to the present disclosure formed by the above method includes the monocrystalline substrate 10 of a heterogeneous material from nitride semiconductor and the crystallized inorganic thin film 30' as shown in the right picture in (e) of FIG. 1.

A plurality of cavities C that is separated from each other between the substrate 10 and the inorganic thin film 30' is defined to have controlled shape and size and a two-dimensional array. The semiconductor stacking structure 100 includes the nitride semiconductor layer 50 that grows on the inorganic thin film 30' crystallized on the cavities C and is combined to form the voids V at the areas between the cavities C.

The inorganic thin film 30' includes a leg portion 30a that comes into contact with the substrate 10 and an upper surface portion 30b that extends from the leg portion 30a and is parallel to the substrate 10. The cavities C are where the sacrificial layer pattern 20 is removed away during a formation method. Accordingly, the cavities C conform the shape and size and two-dimensional array of the sacrificial layer pattern 20. Thus, for the cavities C to have the controlled shape and size and two-dimensional array, the shape and size and two-dimensional array of the sacrificial layer pattern 20 needs to be set. In this embodiment, the cavities C are uniformly defined in the same pattern over the entire substrate 10 according to the design of the sacrificial layer pattern 20. However, the cavities may be defined in a locally different pattern according to the design of the sacrificial layer pattern.

Because the cavities C exist, if there is a difference in thermal expansion coefficient between the substrate 10 and the nitride semiconductor layer 50 formed thereon, the cavities C are stretched or compressed in the surface direction, causing a local deformation, so stress energy is consumed. Accordingly, thermal stress applied to the nitride semiconductor layer 50 can be reduced, and thus, a warpage phenomenon of the substrate 10 can be reduced. Accordingly, it is possible to use the substrate 10 with a relatively thin thickness even on large scale.

Particularly, because the cavities C can be controlled by adjusting the shape, size, and two-dimensional array of the sacrificial layer pattern, it is possible to adjust the optical properties, for example, emission pattern of LEDs manufactured from the semiconductor stacking structure 100. Furthermore, because the sacrificial layer pattern 20 is formed by the controlled method such as photolithography or nano-imprint when forming the sacrificial layer pattern 20, the cavities C are not formed irregularly or at random, and are formed by the controlled method, leading to good reproducibility and superior device uniformity.

As a result, the nitride semiconductor layer 50 having outstanding properties can be epitaxially grown, and thus, opto-electronic devices with high efficiency and high reliability can be realized. Furthermore, with the increasing light extraction efficiency, high output LDs and LEDs can be realized.

The semiconductor stacking structure according to the present disclosure includes the substrate 10 and the nitride semiconductor layer 50 connected with the interfacial layer interposed therebetween. The interfacial layer is where the substrate 10 and the nitride semiconductor layer 50 are mechanically separated at an extent by the cavities C and the optional voids V, and thus is in a state in which stress occurrence is further suppressed, and after the nitride semiconductor layer 50 is grown, the nitride semiconductor layer 50 and the substrate 10 can be separated by the separation method and apparatus according to the present disclosure as shown in (f) of FIG. 1.

If a nitride semiconductor layer is grown on a substrate according to general conventional technology, the nitride semiconductor layer and the substrate are joined on atomic level, and to separate the nitride semiconductor layer from the substrate, a special process such as laser lift-off is needed. However, in the present disclosure, the inorganic thin film 30' such as a membrane or a bridge is present in the interfacial layer, making it easy to separate the nitride semiconductor layer 50 from the substrate 10 by destructing the inorganic thin film 30' or separating the interface between the inorganic thin film 30' and the substrate 10 with a small mechanical force without using laser lift-off. Because separation is achieved with a small mechanical force such as tension or compression, separation is achieved without warpage or cracking or chipping of the nitride semiconductor layer 50.

Accordingly, it is very advantageous in the field of applications where separation of the substrate 10 and the nitride semiconductor layer 50 is necessary, for example, the manufacture of a vertical LED or a horizontal LED, a LED transferred to a certain substrate, and recycling of the substrate 10 is easy. In addition, if the nitride semiconductor layer 50 is formed as a thick film and is separated from the substrate 10, it can be used as a nitride semiconductor free-standing substrate, and it makes easy to manufacture a nitride semiconductor substrate as a substrate of the homogeneous material for good nitride semiconductor growth.

Figure 3:
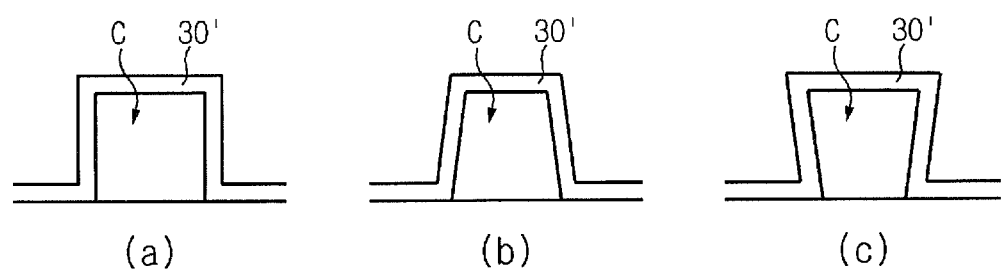
FIG. 3 shows various cross sections of cavity in a semiconductor stacking structure according to the present disclosure.

The shape of the interfacial layer can be designed variously depending on the shape of the sacrificial layer pattern 20. In the example shown in FIG. 1, when the sacrificial layer pattern 20 having the cross section perpendicular to the substrate 10 is rectangular is formed, the cavities C defined by the inorganic thin film 30' also have a rectangular shape in cross section. The cross section of the cavities C may have, as shown as various examples in FIG. 3, (a) a square shape, or (b) a trapezoidal shape with the lower surface wider than the upper surface, or on the contrary, (c) a trapezoidal shape with the lower surface narrower than the upper surface. In these examples, the inorganic thin film 30' has a leg portion that comes into contact with the substrate and an upper surface portion that extends from the leg portion and is parallel to the substrate, and the leg portion is perpendicular to the substrate or has a predetermined inclination. However, the upper surface portion is not necessarily parallel to the substrate. The upper surface portion may have a curved surface such as convex or concave, and like the case that the cross section of the cavities is in a triangular shape, the upper surface portion may be absent. Furthermore, the leg portion does not necessarily have a straight line shape, but the leg portion may also have a curved surface such as convex or concave, and although it is in a straight line shape, the inclination with the substrate may change.

Figure 4:
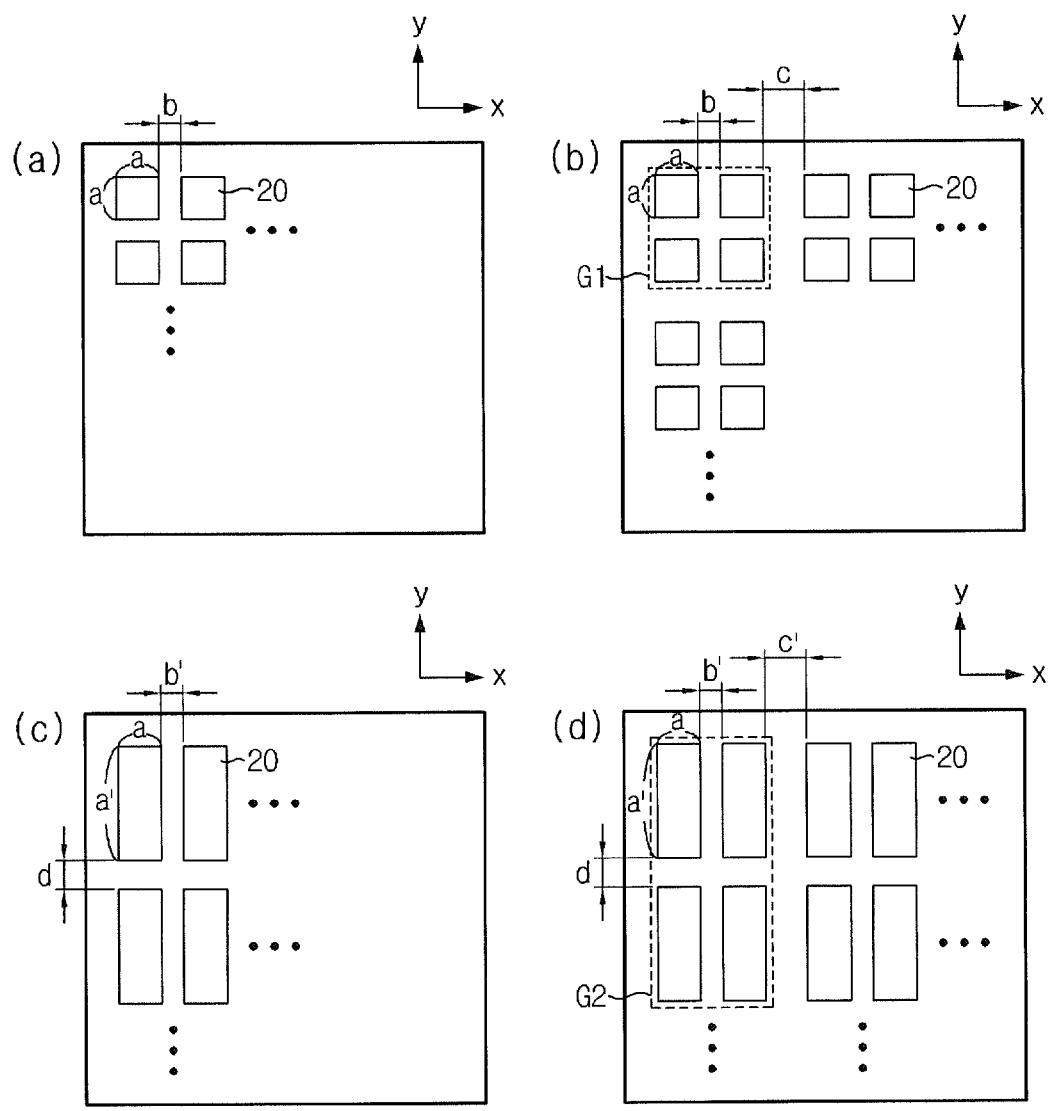
FIG. 4 is a diagram showing various sacrificial layer patterns in a method for forming a semiconductor stacking structure according to the present disclosure, and the resulting shape of an upper surface of an inorganic thin film.

Furthermore, although the sacrificial layer pattern 20 is of a line and space type in the example shown in FIG. 2, the sacrificial layer pattern may have various shapes as shown as various examples in FIG. 4.

FIG. 4 is a diagram showing various sacrificial layer patterns in the method for forming a semiconductor stacking structure according to the present disclosure, and the resulting shape of the upper surface portion of the inorganic thin film. First, referring to (a), patterns of a rectangular shape having the same dimension "a" in width and length are uniformly formed at x and y pitch of "b" when viewed from the top of the substrate. In (b), patterns of a square shape having the same dimension of "a" in width and length are formed at x and y pitch of "b" to create a group G1 and the groups G1 are uniformly formed at x and y pitch of "c". In (c), patterns of a rectangular shape having different dimensions of "a" and "a'" in width and length are formed at x pitch of "b'" and y pitch of "d". b' and d may be the same or different. In (d), patterns of a rectangular shape having different dimensions of "a" and "a'" in width and length are formed at x pitch of "b'" and y pitch of "d" to create a group G2, and the groups G2 are uniformly formed at x and y pitch of "c'". b' and d may be the same or different.

Figure 5:
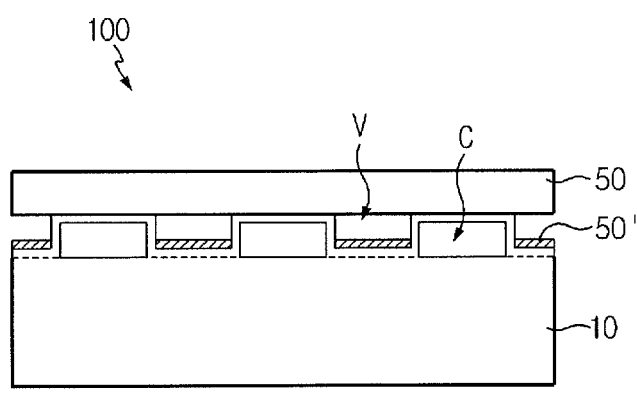
FIG. 5 shows that a part of a nitride semiconductor layer is included in an interfacial layer part in a semiconductor stacking structure according to the present disclosure.

FIG. 5 shows the case in which a part of the nitride semiconductor layer is included in the interfacial layer part in the semiconductor stacking structure according to the present disclosure. According to the embodiments, at the step (e) described with reference to FIG. 1, the nitride semiconductor layer 50' may be formed on the inorganic thin film 30' parts between the cavities C during formation of the nitride semiconductor layer 50. Before the nitride semiconductor layer 50' grows and goes over the upper surface of the inorganic thin film 30', when the nitride semiconductor layer 50 grown on the upper surface of the inorganic thin film 30' is combined, a part of the nitride semiconductor layer 50' is filled between the cavities C and voids V are formed between the upper portion and the nitride semiconductor layer 50 as shown in FIG. 5.

Figure 6:
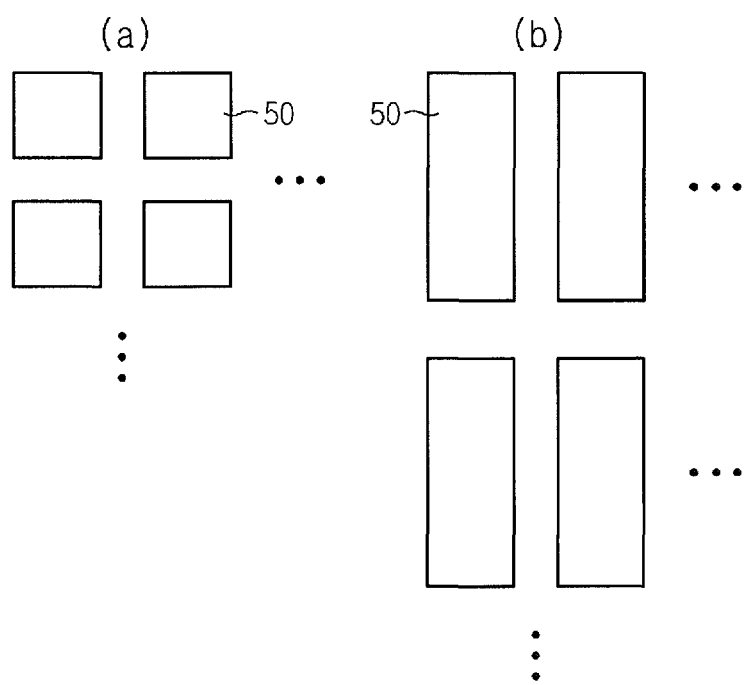
FIG. 6 is a diagram showing the shape of an upper surface of a nitride semiconductor layer in a semiconductor stacking structure according to the present disclosure.

FIG. 6 is a diagram showing the shape of the upper surface of the nitride semiconductor layer in the semiconductor stacking structure according to the present disclosure.

According to the embodiments, before the nitride semiconductor layer 50 is combined, growth may be terminated in the step (e) described with reference to FIG. 1. Then, the nitride semiconductor layer 50 is formed as a plurality of nitride semiconductor layers separated from each other.

(a) of FIG. 6 shows the case in which the sacrificial layer pattern 20 as shown in (a) of FIG. 4, for example, is used and growth is terminated before the nitride semiconductor layer 50 is combined. A plurality of nitride semiconductor layers of a square shape can be obtained. (b) of FIG. 6 shows the case in which the sacrificial layer pattern 20 as shown in (c) of FIG. 4, for example, is used and growth is terminated before the nitride semiconductor layer 50 is combined. A plurality of nitride semiconductor layers of a rectangular shape can be obtained. According to the desired purpose for which the device is used, for example, in the case that a LED chip of a rectangular shape such as a LCD BLU (Back Light Unit) is needed, the shape of the cavities C changes depending on the shape of the sacrificial layer pattern 20 and the shape of the inorganic thin film 30' thereon that serves as a seed layer changes, so the shape of the nitride semiconductor layer 50 formed thereon changes.

As described above, the nitride semiconductor layer 50 may be formed as a plurality of nitride semiconductor layers separated from each other, and if the nitride semiconductor layer 50 is formed with a multilayer structure including an active layer necessary for LED configuration in the manufacture of the nitride semiconductor layer 50, a plurality of nitride semiconductor layers 50 separated from each other is already manufactured in the unit of a chip and thus is separated from each other, so when separating from the substrate 10 by the method for separating a nitride semiconductor layer according to the present disclosure, an advantage is that it is possible to immediately introduce to a packaging process without a conventional device individualization process such as dicing necessary to manufacture a chip unit.

Subsequently, the method and apparatus for separating a nitride semiconductor layer according to the present disclosure is described in more detail.

The method for separating a nitride semiconductor layer according to the present disclosure includes a first method for separation by applying a force in vertical direction to the upper surface and the lower surface of the semiconductor stacking structure 100 according to the present disclosure or a different semiconductor stacking structure having an interfacial layer with cavities formed between a substrate and a nitride semiconductor layer as in the present disclosure, a second method for separation by applying a force in horizontal direction, and a third method for separation by applying a force in relative circular motion.

The first method includes two conditions, compression and tension. First, the compression condition is a method performed by pressing the upper surface and the lower surface to destruct the inorganic thin film or the interfacial layer. The tension condition is a method performed by detaching the upper surface and the lower surface apart from each other to destruct the inorganic thin film or the interfacial layer. The second method is a method of shear condition performed by destructing the inorganic thin film or the interfacial layer with a shearing force moving the upper surface and the lower surface in the horizontal direction relatively to each other. The third method is a method of torsion condition performed by twisting the upper surface and the lower surface around each other into a relatively horizontal circular motion to destruct the inorganic thin film or the interfacial layer.

The first to third methods can be performed in combination. The separation by a mechanical force without using a method such as laser radiation is because of the interfacial layer including the cavities C and the optional voids V in the semiconductor stacking structure 100 according to the present disclosure or other semiconductor stacking structure.

The method for separating a nitride semiconductor layer according to the present disclosure is suitable for implementing this separation method.

Although a description is hereinafter provided based on the case of separating the nitride semiconductor layer 50 from the substrate 10 using the semiconductor stacking structure 100 according to the present disclosure, if even a different structure from the semiconductor stacking structure 100 is a semiconductor stacking structure including an interfacial layer with cavities between a substrate and a nitride semiconductor layer, it is possible to mechanically separate using the separation method and apparatus according to the present disclosure.

Figure 7:
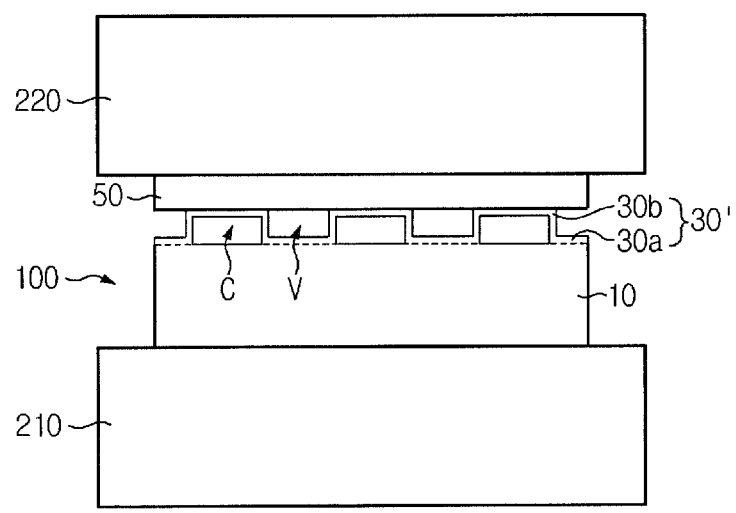
FIG. 7 shows a pair of plate-shaped separation members included in an apparatus for separating a nitride semiconductor layer according to the present disclosure.

As shown in FIG. 7, the separation apparatus according to the present disclosure includes a pair of plate-shaped separation members 210, 220 as jigs respectively applied to the upper surface and the lower surface of the semiconductor stacking structure 100.

The first separation member 210 is placed on the lower surface of the semiconductor stacking structure, i.e., the substrate 10 side. The second separation member 220 is placed on the upper surface of the semiconductor stacking structure, i.e., the nitride semiconductor layer 50 side. The first separation member 210 and the substrate 10 may be temporarily adhered to each other. Likewise, the second separation member 220 and the nitride semiconductor layer 50 may be temporarily adhered to each other. Simple contact without adhesion may be possible. The term temporary as used herein refers to that it exists while the separation step is being performed, and then is removed later. The temporary adhesion may be various methods such as an adhesive layer, adhesive coating, an adhesive tape, an electrostatic force and a force by vacuum. The pair of separation members 210, 220 may be larger than the semiconductor stacking structure 100 to cover the semiconductor stacking structure 100, or may be smaller than the semiconductor stacking structure 100 not to cover the semiconductor stacking structure 100.

Figure 8:
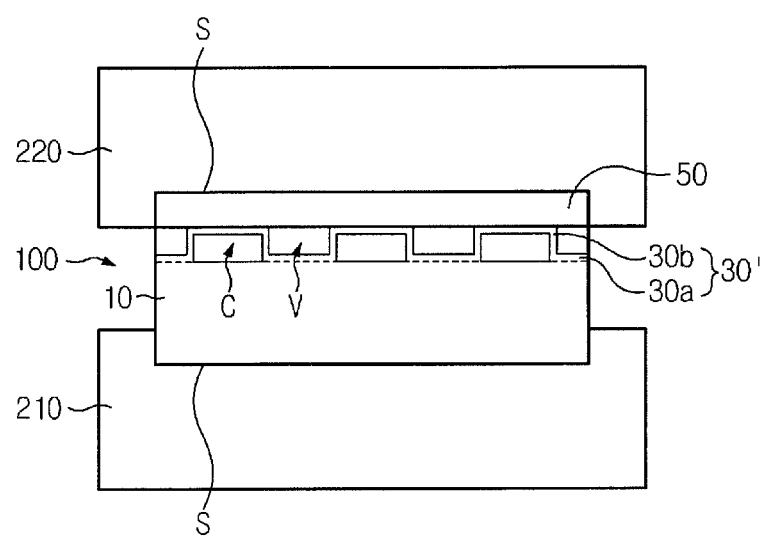
FIG. 8 shows another example of separation members included in an apparatus for separating a nitride semiconductor layer according to the present disclosure.

FIG. 8 shows another example of the separation members 210, 220 included in the apparatus for separating a nitride semiconductor layer according to the present disclosure.

The separation members 210, 220 are generally plate-shaped, but may have mounting grooves S in which the semiconductor stacking structure 100 is mounted. Furthermore, the separation members 210, 220 may further have vacuum supply holes to provide a vacuum force for adsorbing the semiconductor stacking structure 100 through the mounting grooves S. The size of the mounting grooves S may be the same as the size of the semiconductor stacking structure 100, but may be relatively larger than the size of the semiconductor stacking structure 100. In this case, the mounting grooves S can mount various semiconductor stacking structures regardless of the size and shape of the semiconductor stacking structure. The vacuum supply holes are formed to pass through the mounting grooves, and vacuum is provided via the through holes. Accordingly, the mounting grooves S adsorb the semiconductor stacking structure 100 mounted therein, so that the semiconductor stacking structure 100 does not move and is stationary. To this end, the vacuum supply holes are connected to a vacuum supply line connected to a vacuum pump, to supply vacuum from the vacuum pump. Furthermore, the vacuum supply holes may be formed in various patterns, but to uniformly adsorb the entire surface of the semiconductor stacking structure 100 or adsorb the semiconductor stacking structure of various sizes regardless of the size of the semiconductor stacking structure 100, the vacuum supply holes may be formed in radial pattern. The mounting grooves S may be formed in only any one of the separation members 210, 220.

Figure 9:
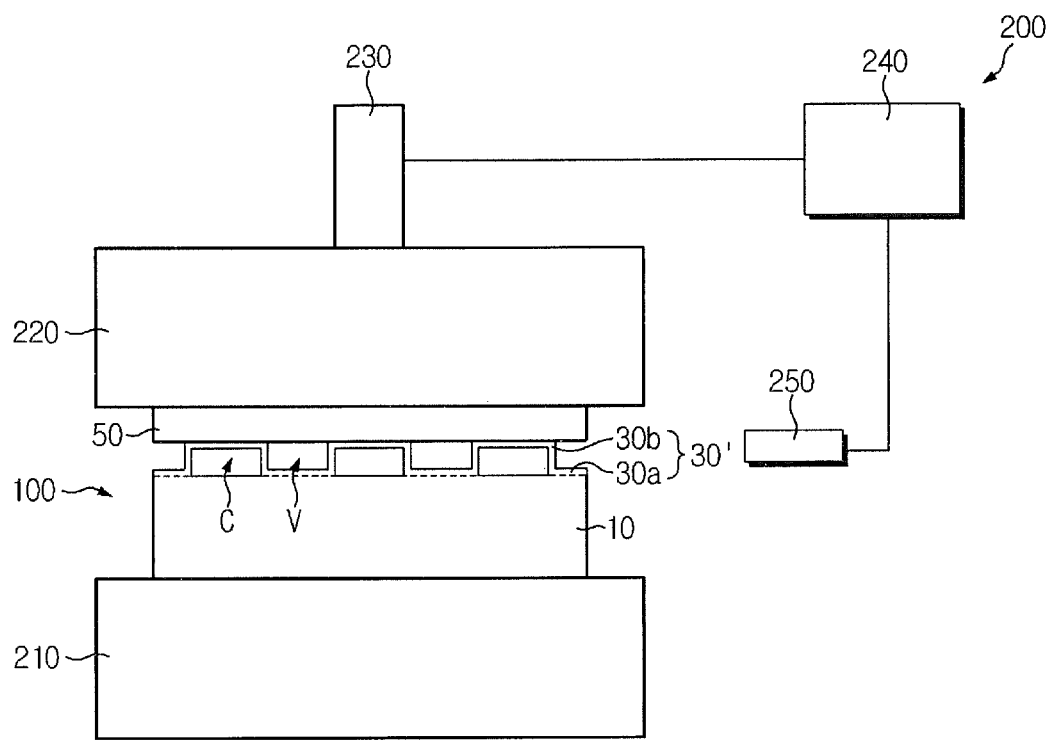
FIG. 9 is a schematic diagram of an apparatus for separating a nitride semiconductor layer according to the present disclosure.

The pair of separation members 210, 220 may be introduced to a separation apparatus 200 including a driving unit 230 which applies an external force and a control unit 240 while supporting the semiconductor stacking structure 100 therebetween as shown in FIG. 9. In this instance, the separation members 210, 220 may have a temporary adhesive layer interposed therebetween to support the semiconductor stacking structure 100 well. Another method is sequential introduction in the order of introducing the first separation member 210 to the separation apparatus 200 first, placing the semiconductor stacking structure 100 thereon, and introducing the second separation member 220. To support or hold the separation members 210, 220 being introduced, the separation apparatus 200 may further include appropriate base member and holding member.

Instead, the pair of separation members 210, 220 may be configured as part of the separation apparatus 200. In this instance, it is ready for separation step in the manner of placing the semiconductor stacking structure 100 on the first separation member 210, and moving the second separation member 220 to the semiconductor stacking structure 100 side to allow the separation members 210, 220 to support the semiconductor stacking structure 100, or moving the second separation member 220 apart from the semiconductor stacking structure 100 to allow the first separation member 210 to support the semiconductor stacking structure 100.

To facilitate absorption/desorption in response to current on/off, an electrostatic force and a force by vacuum may be preferable for the separation members 210, 220 to support the semiconductor stacking structure 100, and to this end, the separation apparatus 200 may further include various components such as an electrostatic generation device and a vacuum pump.

For mechanical separation of the substrate 10 and the nitride semiconductor layer 50, the separation apparatus 200 may apply at least one of relative compression, tension, shear and torsion or its combination, to the pair of separation members 210, 220. As these conditions are created by the relative movement of the separation members 210, 220, any of the separation members 210, 220 may be stationary and an external force by the driving unit 230 may be applied to the other. Preferably, it is preferred that the separation member placed on the lower side is stationary in terms of stability. Although this embodiment shows that the separation member placed on the lower side is the first separation member 210 contacting with the substrate 10, the second separation member 220 contacting with the nitride semiconductor layer 50 may be placed on the lower side.

First, to apply the first method, the driving unit 230 is equipped with a driving means to drive, in the vertical direction, the second separation member 220 placed on the upper side among the separation members 210, 220 facing each other. The driving means is, for example, an air cylinder, a pneumatic motor, an electric motor or a hydraulic motor, and drives the second separation member 220 in the vertical direction (upward and downward) until the substrate 10 and the nitride semiconductor layer 50 are separated.

Figure 10:
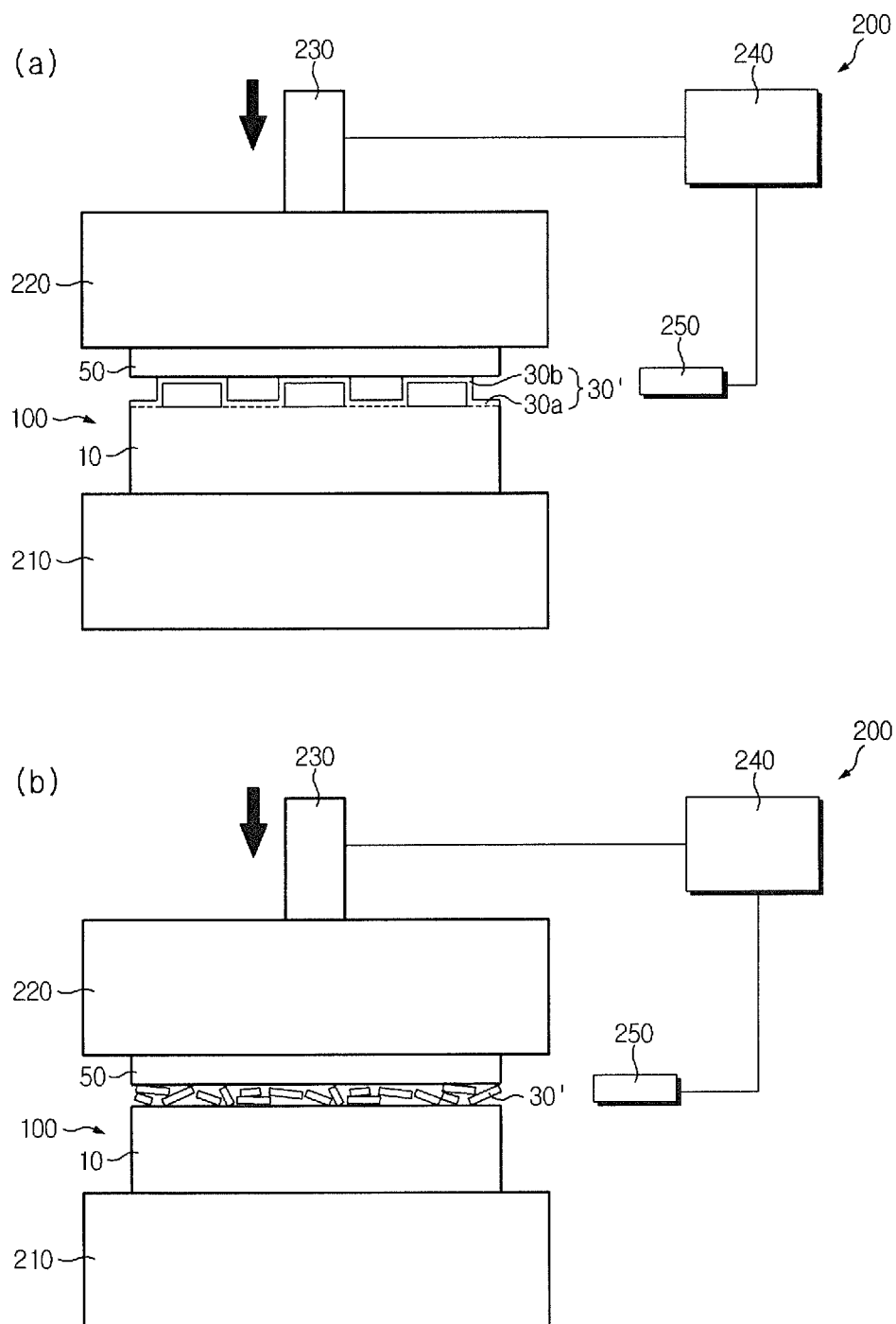
FIG. 10 shows separation of a nitride semiconductor layer from a substrate under compression using an apparatus for separating a nitride semiconductor layer according to the present disclosure.

In the first method, to create a compression condition, the driving unit 230 drives the second separation member 220 downwards to provide a compression force. (a) of FIG. 10 shows the case in which the nitride semiconductor layer 50 and the substrate 10 are separated under compression. (b) of FIG. 10 shows the case in which the nitride semiconductor layer 50 and the substrate 10 are separated by destructing the inorganic thin film 30'. In this instance, immediately after the nitride semiconductor layer 50 and the substrate 10 are separated by the destruction of the inorganic thin film 30', the destruction of the nitride semiconductor layer 50 can be prevented by releasing the force pressing down the second separation member 220. The destructed part of the inorganic thin film 30' may be adhered to the nitride semiconductor layer 50.

Accordingly, in the case of compression condition creation, end point detection is needed, and in the end point detection, the control unit 240 controls the driving unit 230 to stop the movement of the second separation member 220 in that state or move up the second separation member 220. The end point detection can implement the following method and apparatus.

A separation sensing unit 250 that may be further included in the separation apparatus 200 may sense the extent to which the nitride semiconductor layer 50 and the substrate 10 are separated by many methods. Particularly, the extent to which the nitride semiconductor layer 50 and the substrate 10 are separated may be sensed by measuring the distance (can be converted to compressed thickness) between the separation members 210, 220. The separation sensing unit 250 may be attached at any location where the distance between the separation members 210, 220 can be measured. The separation sensing unit 250 is not limited to a particular type, if it can measure the distance between objects spaced apart from each other in real time, such as a laser sensor, a capacitive sensor, and an encoder.

Provided an initial state in which the semiconductor stacking structure 100 is inserted between the separation members 210, 220 is defined as a start point, and if the second separation member 220 moves down to less than the thickness of the part where the inorganic thin film 30' is formed, i.e., the interfacial layer, the time when the lower surface the nitride semiconductor layer 50 and the substrate 10 are determined to be separated is defined as a separation point, the control unit 240 applies a predetermined pressure to the second separation member 220 or gradually increases the applied pressure until the separation members 210, 220 move to the separation point location, and after the separation point location is reached, the operation of the second separation member 220 is regulated by controlling the driving unit 230 to completely release the applied pressure or lift up the second separation member 220.

As such, using the separation sensing unit 250 and the control unit 240, the applied pressure can be adjusted based on the extent to which the nitride semiconductor layer 50 and the substrate 10 are separated, thereby preventing damage of the nitride semiconductor layer 50 caused by excessive pressure applied in compressed state.

The separation sensing unit 250 may be also implemented by a pressure monitoring method. This uses the principle that slowly increasing pressure is sensed while the inorganic thin film 30' endures the compression force, but rapid pressure changes occur at the moment when the inorganic thin film 30' is destructed by the compression force. To implement this method, the separation sensing unit 250 is configured to monitor the pressure applied to the inorganic thin film 30'. Preferably, in this instance, the separation sensing unit 250 assumes configuration of a load cell. The load cell may be mounted on any of the separation members 210, 220, or any of the separation members 210, 220 may be realized as a load cell itself. The load cell is a device for monitoring pressure changes in response to the applied compression force, and the moment at which the pressure is released or rapidly changes through the load cell is determined as a separation point at which the nitride semiconductor layer 50 and the substrate 10 are separated, and after the separation point location is reached, the operation of the second separation member 220 is regulated by controlling the driving unit 230 to completely release the applied pressure or lift up the second separation member 220.

Figure 11:
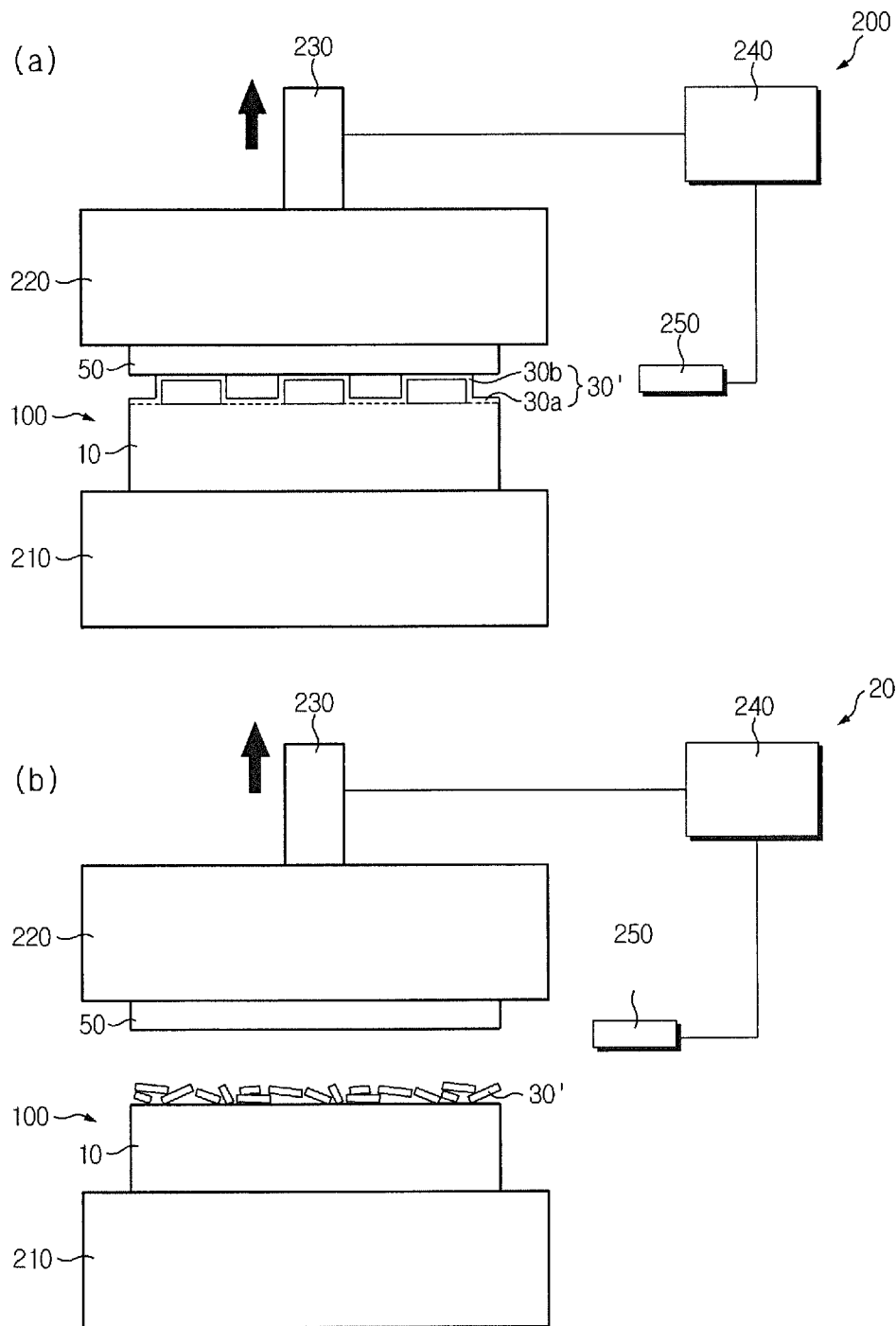
FIG. 11 shows separation of a nitride semiconductor layer from a substrate under tension using an apparatus for separating a nitride semiconductor layer according to the present disclosure.

Subsequently, to create the tension condition in the first method, while the semiconductor stacking structure 100 is surely fixed to the separation members 210, 220, the driving unit 230 drives the second separation member 220 upwards to provide a tensile force. (a) of FIG. 11 shows the case in which the nitride semiconductor layer 50 and the substrate 10 are separated under tension using the apparatus for separating a nitride semiconductor layer according to the present disclosure. The tension condition is a method performed by detaching the separation members 210, 220 apart from each other to destruct the inorganic thin film 30'. The tensile force may be applied until the nitride semiconductor layer 50 and the substrate 10 are separated, in other words, until the separation members 210, 220 are spaced farther apart than before the start of separation. In this instance, end point detection is not essential. (b) of FIG. 11 shows the case in which the nitride semiconductor layer 50 and the substrate 10 are separated under tension. In this instance, the inorganic thin film 30' may be partially attached to the nitride semiconductor layer 50 or remain on the substrate 10.

Figure 12:
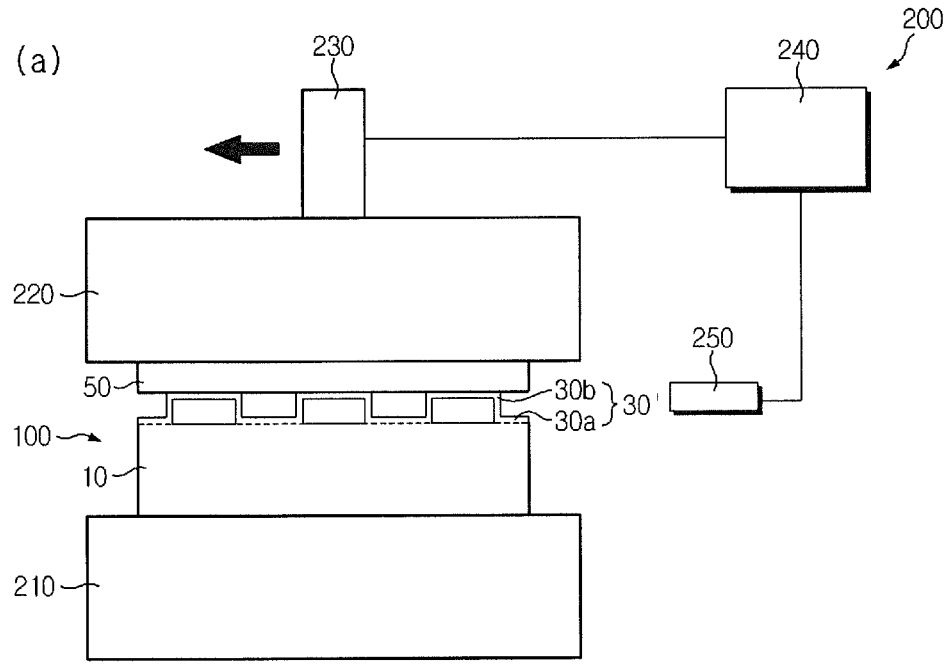
FIG. 12 shows separation of a nitride semiconductor layer from a substrate under shear using an apparatus for separating a nitride semiconductor layer according to the present disclosure.
Figure 12:
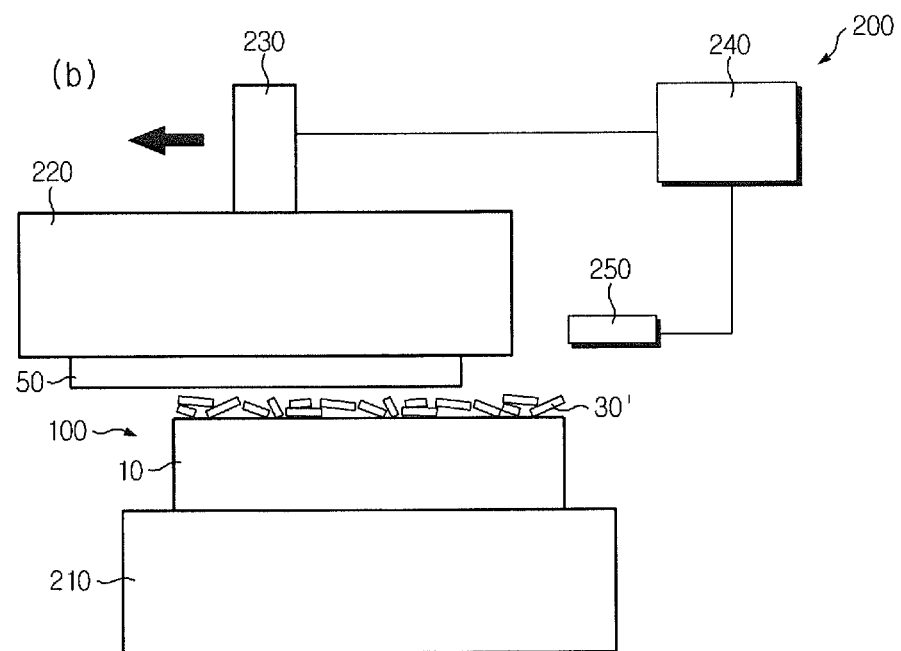

Next, to implement the second method or the shear condition, the driving unit 230 provides a shearing force by pushing the second separation member 220 in the horizontal direction against the first separation member 210. (a) of FIG. 12 shows the case in which the nitride semiconductor layer 50 and the substrate 10 are separated under shear using the apparatus for separating a nitride semiconductor layer according to the present disclosure. The shearing force may be applied until the nitride semiconductor layer 50 and the substrate 10 are separated by destructing the inorganic thin film 30', in other words, until a relative horizontal movement between the separation members 210, 220 occurs. Likewise, in this instance, end point detection is not essential. (b) of FIG. 12 shows the case in which the nitride semiconductor layer 50 and the substrate 10 are separated under shear. In this instance, the inorganic thin film 30' may be partially attached to the nitride semiconductor layer 50 or remain on the substrate 10.

Figure 13:
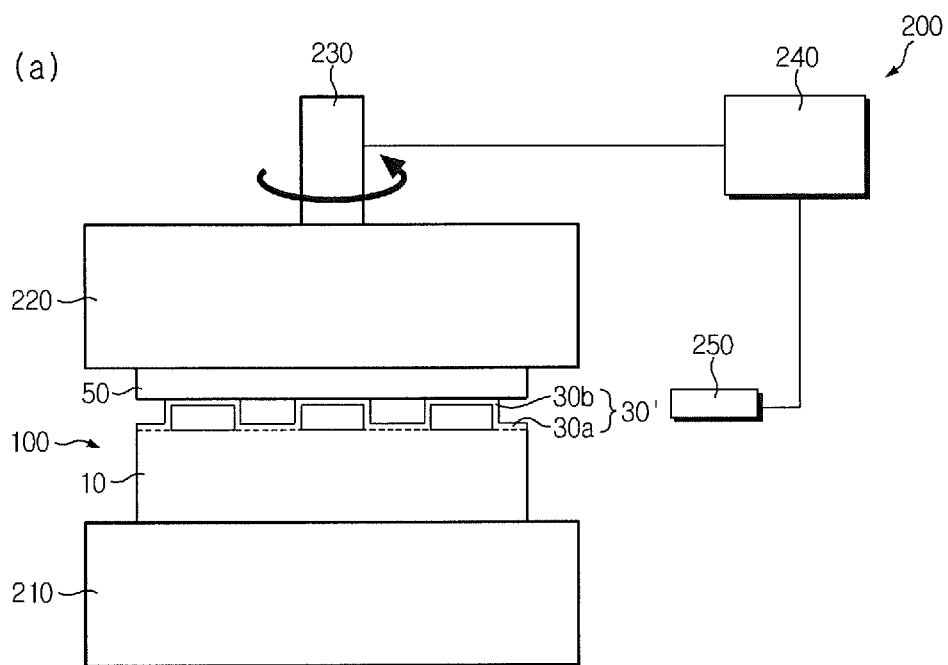
FIG. 13 shows separation of a nitride semiconductor layer from a substrate under torsion using an apparatus for separating a nitride semiconductor layer according to the present disclosure.
Figure 13:
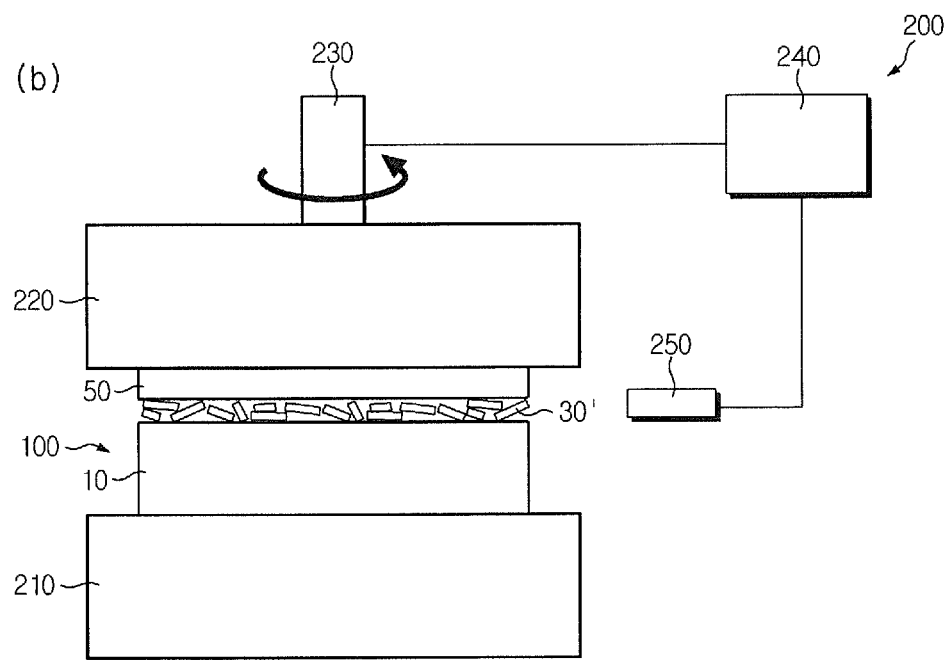

Next, to implement the third method or the torsion condition, the driving unit 230 provides a force of twisting the second separation member 220 relative to the first separation member 210 or a rotational force around the axis perpendicular to the second separation member 220. (a) of FIG. 13 shows the case in which the nitride semiconductor layer 50 and the substrate 10 are separated under torsion using the apparatus for separating a nitride semiconductor layer according to the present disclosure. The rotational force may be applied until the nitride semiconductor layer 50 and the substrate 10 are separated by destructing the inorganic thin film 30', in other words, until a relative circular motion between the separation members 210, 220 can be made. Likewise, in this instance, end point detection is not essential. (b) of FIG. 13 shows the case in which the nitride semiconductor layer 50 and the substrate 10 are separated under torsion. In this instance, the inorganic thin film 30' may be partially attached to the nitride semiconductor layer 50 or remain on the substrate 10.

The nitride semiconductor layer 50 separated by the separation method and apparatus 200 may be transferred to other substrate and processed into a device type after going through a predetermined process for removing the attached part or pieces of the inorganic thin film 30', or without such process, and as described with reference to FIG. 6, if the nitride semiconductor layer 50 has been already manufactured in chip unit and separated, the nitride semiconductor layer 50 may be directly introduced to a packaging process without a process such as dicing. To transfer the nitride semiconductor layer 50 separated from the substrate 10 to other substrate or introduce the nitride semiconductor layer 50 to other process, the separation apparatus 200 may further include an apparatus (not shown) for conveying the separated nitride semiconductor layer to a next destination, and an apparatus (not shown) for removing the parts or pieces of the inorganic thin film 30' attached to the nitride semiconductor layer 50.

In this embodiment, as the nitride semiconductor layer 50 is temporarily adhered to the second separation member 220 side, after the second separation member 220 facing down is revered, the temporary adhesion is released, and to convey the nitride semiconductor layer 50 to a next destination, the separation apparatus 200 may have an apparatus configuration to reverse the second separation member 220. In the case that the second separation member 220 side to which the nitride semiconductor layer 50 is temporarily adhered is formed on the lower side of the separation apparatus 200, this reversing apparatus configuration may not be needed.

The substrate 10 remaining after separation may be recycled for growth of other nitride semiconductor layer. The conveyance of the semiconductor stacking structure 100, and the substrate 10 and the nitride semiconductor layer 50 separated from each other may be performed by transfer equipment including a transfer arm.

According to the separation method and apparatus, the substrate and the nitride semiconductor layer can be separated by a small mechanical force with no need to use high density high output energy such as a laser. The process and apparatus configuration is simple and the process time is short. This apparatus does not create a vacuum or particular gas atmosphere, eliminating the need for an airtight chamber space, thereby providing economic efficiency. Because the method and apparatus can separate the nitride semiconductor layer from the substrate economically without influencing the grown nitride semiconductor layer, utilization is high in the field of manufacture of LEDs or nitride semiconductor substrate transferred to vertical, horizontal, or any other substrate that need to separate a nitride semiconductor layer. If the nitride semiconductor layer is separated, heat generated during operation of a device can be easily removed, and in the case in which a substrate exists, an advantage is to let light trapped in the substrate, not escaping, out, and it is worth being used as substrates of a homogeneous material for nitride semiconductor growth.

Hereinafter, the present disclosure is described in more detail by describing experimental results according to the present disclosure.

Figure 14:
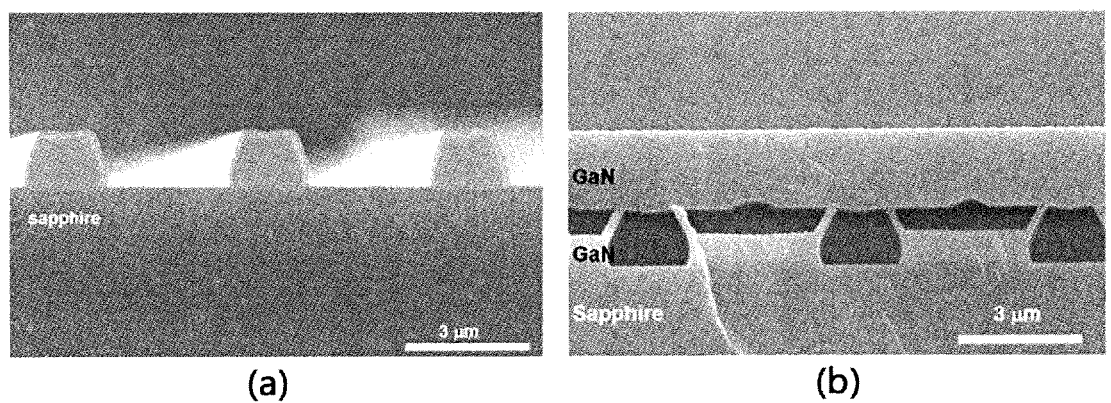
FIGS. 14 and 15 are SEM images showing an experimental example according to the present disclosure.

The test process is as follows. As described with reference to FIG. 1, after a line and space type PR pattern was formed on a sapphire substrate, an alumina thin film was formed by ALD at 110° C. Subsequently, thermal treatment was performed in air to remove the PR pattern and thereby form cavities and the alumina thin film was crystallized. (a) of FIG. 14 is an SEM photographic image showing the cavities and the alumina thin film formed on the sapphire substrate by this method.

Subsequently, a GaN layer was grown on the alumina thin film. By selectively growing a GaN layer from the alumina thin film on the cavities through adjusting the growth temperature, the gas flow rate, and the pressure, a GaN layer as shown in (b) of FIG. 14 was obtained. As can be seen in (b) of FIG. 14, the GaN layer was selectively grown at the cavity part, not the substrate part, and parts of the GaN layer and voids were formed between the cavities as shown in FIG. 5.

Figure 15:
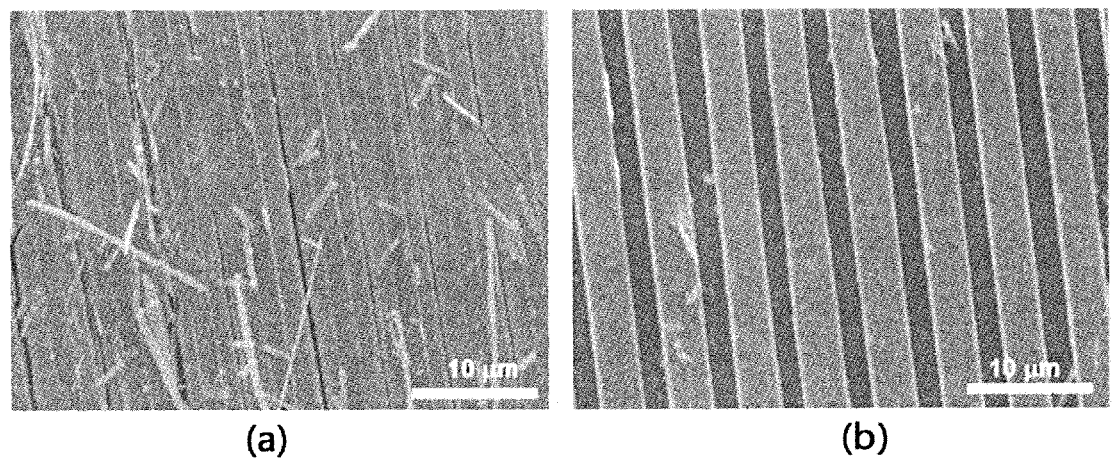

Subsequently, the GaN layer and the sapphire substrate were separated through mechanical separation as proposed by the present disclosure. (a) of FIG. 15 is an SEM photographic image of the GaN layer after separation and (b) is an SEM photographic image of the substrate. As presented in FIG. 15, the GaN layer and the sapphire substrate could be successfully separated through mechanical separation.

Although the preferred embodiments of the present disclosure have been hereinabove illustrated and described, the present disclosure is not limited to the above-mentioned particular preferred embodiments, and it is obvious to those skilled in the art to make various modifications in embodiment without departing from the nature of the appended claims, and such modification fall within the scope of the appended claims.

What is claimed is:

1. A method for manufacturing a structure comprising a nitride semiconductor layer, comprising:
    forming a sacrificial layer pattern on a substrate;
    forming a thin film on the sacrificial layer pattern;
    removing the sacrificial layer pattern from the substrate with the thin film, to form cavities defined by the substrate and the thin film
    crystalizing at least a part of the thin film with the same crystal structure as the substrate; and
    growing the nitride semiconductor layer from the crystalized thin film on the cavities to form a void between the cavities.

2. The method for manufacturing the structure comprising the nitride semiconductor layer according to claim 1, wherein the growing the nitride semiconductor layer comprises combining nitride semiconductor materials grown on at least two portion of the crystalized thin film on the cavities to form the nitride semiconductor layer and to form the void between the cavities.

3. The method for manufacturing the structure comprising the nitride semiconductor layer according to claim 1, wherein the void contacts the nitride semiconductor layer directly.

4. The method for manufacturing the structure comprising the nitride semiconductor layer according to claim 1, wherein the void contacts the crystalized thin film directly.

5. The method for manufacturing the structure comprising the nitride semiconductor layer according to claim 1, wherein the void is surrounded by the nitride semiconductor layer and the crystalized thin film.

6. The method for manufacturing the structure comprising the nitride semiconductor layer according to claim 1, wherein a thickness of the nitride semiconductor layer is thicker than a thickness of the crystalized thin film.

7. The method for manufacturing the structure comprising the nitride semiconductor layer according to claim 1, wherein the thin film comprises:
    a leg portion contacting the substrate; and
    an upper surface portion extending from the leg portion.

8. The method for manufacturing the structure comprising the nitride semiconductor layer according to claim 7, wherein the upper surface portion comprises at least one of a parallel surface to the substrate and a curved surface.

9. The method for manufacturing the structure comprising the nitride semiconductor layer according to claim 7, wherein the leg portion comprises at least one of a perpendicular portion to the substrate, a predetermined inclined portion to the substrate, and a curved portion.

10. The method for manufacturing the structure comprising the nitride semiconductor layer according to claim 1, wherein the nitride semiconductor layer comprises a plurality of nitride semiconductor layers separated from each other.

11. The method for manufacturing the structure comprising the nitride semiconductor layer according to claim 1, wherein the nitride semiconductor layer is a component of a laser diode or a light emitting diode.

12. The method for manufacturing the structure comprising the nitride semiconductor layer according to claim 1, wherein the substrate comprises monocrystalline material different from nitride semiconductor.

13. The method for manufacturing the structure comprising the nitride semiconductor layer according to claim 1, wherein the thin film comprises an inorganic material.

14. The method for manufacturing the structure comprising the nitride semiconductor layer according to claim 1, further comprising: transferring the nitride semiconductor layer from the substrate to other substrate.

15. The method for manufacturing the structure comprising the nitride semiconductor layer according to claim 1, wherein the transferring the nitride semiconductor layer comprises mechanically separating the nitride semiconductor layer from the substrate.

16. The method for manufacturing the structure comprising the nitride semiconductor layer according to claim 15, wherein the mechanically separating is performed by at least one of a method for separation by applying a force in vertical direction to the substrate and the nitride semiconductor layer, a method for separation by applying a force in horizontal direction, and a method for separation by applying a force in relative circular motion.

17. The method for manufacturing the structure comprising the nitride semiconductor layer according to claim 16, wherein end point detection is performed by sensing thickness or pressure at which the substrate and the nitride semiconductor layer are compressed in vertical direction.

18. The method for manufacturing the structure comprising the nitride semiconductor layer according to claim 14, wherein the nitride semiconductor layer is transferred to the other substrate without dicing the nitride semiconductor layer.

19. The method for manufacturing the structure comprising the nitride semiconductor layer according to claim 14, further comprising:
   packaging the transferred nitride semiconductor layer.

20. A semiconductor stacking structure comprising:
   a substrate;
   a thin film disposed on the substrate to define cavities between the thin film and the substrate, wherein at least a part of the thin film is crystalized with same crystal structure as the substrate; and
   a nitride semiconductor layer grown from the thin film on the cavities,
   wherein the nitride semiconductor layer defines a void between the cavities.

* * * * *